United States Patent
Petilli et al.

(10) Patent No.: US 7,576,671 B2
(45) Date of Patent: Aug. 18, 2009

(54) MISMATCH-SHAPING DYNAMIC ELEMENT MATCHING SYSTEMS AND METHODS FOR MULTI-BIT SIGMA-DELTA DATA CONVERTERS

(75) Inventors: Eugene M. Petilli, Victor, NY (US); Mucahit Kozak, Victor, NY (US); Brian Jadus, Williston, VT (US)

(73) Assignee: Intrinsix Corporation, Marlborough, MA (US)

( * ) Notice: Subject to any disclaimer, the term of this patent is extended or adjusted under 35 U.S.C. 154(b) by 0 days.

(21) Appl. No.: 11/679,388

(22) Filed: Feb. 27, 2007

(65) Prior Publication Data
US 2007/0241950 A1    Oct. 18, 2007

Related U.S. Application Data

(63) Continuation-in-part of application No. 11/208,430, filed on Aug. 19, 2005.

(60) Provisional application No. 60/792,573, filed on Apr. 16, 2006.

(51) Int. Cl.
*H03M 3/00* (2006.01)
(52) U.S. Cl. ............... 341/143; 341/155
(58) Field of Classification Search ............ 341/143, 341/155, 144
See application file for complete search history.

(56) References Cited

U.S. PATENT DOCUMENTS

| | | | |
|---|---|---|---|
| 4,974,236 A | 11/1990 | Gurcan et al. | |
| 5,357,252 A | 10/1994 | Ledzius et al. | |
| 5,392,042 A | 2/1995 | Pellon | |
| 5,467,294 A | 11/1995 | Hu et al. | |
| 5,563,535 A | 10/1996 | Corry et al. | |
| 5,608,400 A | 3/1997 | Pellon | |
| 5,701,106 A | 12/1997 | Pikkarainen et al. | |
| 5,712,628 A | 1/1998 | Phillips et al. | |

(Continued)

FOREIGN PATENT DOCUMENTS

EP   0999645 A1   5/2000

OTHER PUBLICATIONS

Notification of Transmittal of The International Search Report and the Written Opinion of the International Searching Authority, or the Declaration, dated Jul. 13, 2007, (Form PCT/ISA/220).

(Continued)

*Primary Examiner*—Peguy JeanPierre
(74) *Attorney, Agent, or Firm*—Daly, Crowley, Mofford & Durkee, LLP

(57) ABSTRACT

A sigma delta modulator (SDM) data converter system is provided. The SDM data converter system comprises a signal path, a feedback signal path, and a multi-bit quantizer disposed in a feedforward path. The signal path receives an input signal to be processed. The feedback signal path provides a feedback signal that is subtracted from the input signal. The multi-bit quantizer is disposed in the feedforward path so as to receive the input signal after the feedback signal has been subtracted from it. Te multi-bit quantizer uses feedforward dynamic element matching (DEM) to spectrally shape mismatch errors in the SDM data conversion system and produce an output signal, wherein the output signal of the multi-bit quantizer is used for at least a portion of the feedback signal.

37 Claims, 9 Drawing Sheets

U.S. PATENT DOCUMENTS

| | | | |
|---|---|---|---|
| 5,715,281 | A | 2/1998 | Bly et al. |
| 5,732,330 | A | 3/1998 | Anderson et al. |
| 5,760,722 | A | 6/1998 | Harris et al. |
| 5,810,930 | A | 9/1998 | Eom et al. |
| 5,841,388 | A | 11/1998 | Yasuda et al. |
| 5,950,124 | A | 9/1999 | Trompower et al. |
| 5,981,428 | A | 11/1999 | Mitsuhashi et al. |
| 5,982,313 | A | 11/1999 | Brooks et al. |
| 6,005,506 | A | 12/1999 | Bazarjani et al. |
| 6,148,048 | A | 11/2000 | Kerth et al. |
| 6,151,071 | A | 11/2000 | Petilli |
| 6,160,859 | A | 12/2000 | Martin et al. |
| 6,225,928 | B1 | 5/2001 | Green |
| 6,304,608 | B1 * | 10/2001 | Chen et al. ................. 375/252 |
| 6,310,908 | B1 | 10/2001 | Reed et al. |
| 6,329,939 | B1 | 12/2001 | Swaminathan et al. |
| 6,330,290 | B1 | 12/2001 | Glas |
| 6,346,898 | B1 * | 2/2002 | Melanson ................. 341/143 |
| 6,381,265 | B1 | 4/2002 | Hessel et al. |
| 6,396,428 | B1 | 5/2002 | Cheng |
| 6,397,051 | B1 | 5/2002 | Abbasi et al. |
| 6,405,022 | B1 | 6/2002 | Roberts et al. |
| 6,426,714 | B1 * | 7/2002 | Ruha et al. ................. 341/143 |
| 6,437,718 | B1 | 8/2002 | Oyama et al. |
| 6,459,743 | B1 | 10/2002 | Lipka |
| 6,476,746 | B2 | 11/2002 | Viswanathan |
| 6,539,052 | B1 | 3/2003 | Hessel et al. |
| 6,606,007 | B1 | 8/2003 | Washburn |
| 6,631,255 | B1 | 10/2003 | Claxton et al. |
| 6,639,481 | B1 | 10/2003 | Ravi et al. |
| 6,677,875 | B2 | 1/2004 | Dagher et al. |
| 6,697,003 | B1 | 2/2004 | Chen |
| 6,704,558 | B1 | 3/2004 | Sorrells et al. |
| 6,738,608 | B2 | 5/2004 | Black et al. |
| 6,741,197 | B1 * | 5/2004 | Melanson ................. 341/150 |
| 6,744,392 | B2 * | 6/2004 | Melanson ................. 341/143 |
| 6,765,517 | B1 | 7/2004 | Ali |
| 7,183,955 | B1 * | 2/2007 | Shih ................. 341/143 |
| 2003/0043933 | A1 | 3/2003 | Kintis |
| 2003/0078020 | A1 | 4/2003 | Kintis |
| 2003/0081803 | A1 | 5/2003 | Petilli et al. |
| 2003/0095615 | A1 | 5/2003 | Kintis et al. |
| 2003/0152160 | A1 | 8/2003 | Bauch et al. |
| 2003/0185288 | A1 | 10/2003 | Hinrichs et al. |

OTHER PUBLICATIONS

International Search Report (Form PCT/ISA/210).

Written Opinion of the International Searching Authority (Form PCT/ISA/237).

Dörrer, et al, "A 3-mW 74-dB SNR 2-MHz Continuous-Time Delta-Sigma ADC With a Tracking ADC Quantizer in 0.13-μm CMOS", IEEE Journal of Solid-State Circuits, vol. 40, No. 12, Dec. 2005, pp. 2416-2427, XP002440494.

International Preliminary Report on Patentability (Form PCT/IB/373) and Written Opinion (Form PCT/ISA/237) for PCT/US2007/005108, dated Oct. 21, 2008, 6 pages.

Notification of Transmittal of The International Search Report and the Written Opinion of the International Searching Authority, or the Declaration, dated Jul. 13, 2007, (Form PCT/ISA/220), Oct. 2005.

International Search Report (Form PCT/ISA/210), Apr. 2005.

Written Opinion of the International Searching Authority (Form PCT/ISA/237), Apr. 2005.

International Search Report and Written Opinion for PCT/US2005/029560, dated Jan. 26, 2006, 13 pages.

Hussein et al. "Bandpass ΣΔ Modular Emplying Undersampling of RF Signals for Wireless Communication;" IEEE Transactions on Circuits and Systems II: Analog and Digital Signal Processing, vol. 47, Jul. 7, 2000, pp. 614-620.

Jantzi et al, "Quadrature Bandpass ΣΔ Modulation for Digital Radio;" IEEE Journal of Solid State Circuits, vol. 32, Dec. 12, 1997, pp. 1935-1950.

H. Tao et al., "A 400 Ms/s Frequency Translating Bandpass Sigma Delta Modulator"; IEEE Journal Of Solid State Circuits, vol. 34, Dec. 12, 1999, pp. 1741-1752.

Wu et al., "Weaver Architecture with Bandpass Delta-Sigma A/d Converters", IEEE, Aug. 1998.

Paulus et al., "TP 3.2: A CMOS IF Transceiver for Narrowband PCS", Feb. 5,1998 IEEE International Solid State Circuits Conference, Digest of Technical Papers, p. 46-47.

PAIR file for U.S. Appl. No. 11/208,430, filed Aug. 19, 2005, file through Jan. 29, 2009, 225 pages.

Jantzi et al. "A Quadrature Bandpass ΣΔModulator for Digital Radio", IEEE International Solid-State Circuits Conference, Feb. 1997, 3 pages.

PAIR file for U.S. Appl. No. 11/208,430, filed Aug. 19, 2005, file through Jun. 2, 2009, 588 pages.

* cited by examiner

PRIOR ART

MISMATCH-SHAPING DYNAMIC ELEMENT MATCHING SYSTEMS AND METHODS FOR MULTI-BIT SIGMA-DELTA DATA CONVERTERS

Cross-Reference to Related Applications

This patent application claims priority to a provisional patent application serial number 60/792,573, filed Apr. 16, 2006, entitled "Mismatch-Shaping Dynamic Element Matching Method For Multi-Bit Sigma-Delta Data Converters," by Mucahit Kozak, Eugene M. Petilli, and Brian Jadus. The contents of this provisional patent application are hereby incorporated by reference.

This patent application is a continuation-in-part of non-provisional patent application Ser. No. 11/208,430, filed Aug. 19, 2005, entitled "Hybrid Heterodyne Transmitters and Receivers," by Eugene M. Petilli, Brian Jadus, Clyde Washburn, and John M. Alvermann. The contents of this nonprovisional patent application are hereby incorporated by reference.

STATEMENT REGARDING FEDERALLY SPONSORED RESEARCH

Not applicable

FIELD OF THE INVENTION

The present invention relates generally to sigma delta converters, and, in particular, to multi-bit sigma-delta data converters employing dynamic element matching (DEM) and the corresponding systems and methods.

BACKGROUND OF THE INVENTION

Sigma-delta modulators or sigma-delta modulation (both of them hereinafter referred to as SDM) are recognized as proven methods that are extensively employed in high-resolution data conversion applications. They simultaneously utilize noise shaping and oversampling techniques to reduce the quantization noise power within the input signal bandwidth, achieving higher resolution and linearity compared to a Nyquist-rate data converter. Because of the oversampling requirement, however, SDMs have been employed in relatively low bandwidth applications such as digital audio, voice, ISDN (Integrated Services Digital Network), and instrumentation applications with nearly excellent results. With the recent developments in Very Large Scale Integration (VLSI) technologies, SDMs have become attractive in relatively wide bandwidth applications, as well. Essentially, the constant evolution in video technologies (such as HDTV), and wireline communication services (such as xDSL) and wireless communication systems (such as 3G and 4G mobile communication standards) increasingly demands higher-resolution and wider bandwidth from an SDM data converter.

An exemplary SDM includes a quantizer in a negative feedback configuration to spectrally shape the quantization noise away from the input signal spectrum. The number of levels of the internal quantizer used in an SDM is usually two (i.e., a single-bit quantizer). Single-bit SDMs have found widespread applications due to their inherent linearity and simplicity. One drawback of at least some single-bit SDMs, however, is that to obtain a higher resolution or wider bandwidth, a higher-order feedback loop is used, which in turn can cause stability problems and significantly reduce the maximum allowable input range. Also, the required oversampling ratio (OSR, where OSR is defined as the ratio between the sampling rate of the output to the two times the input signal bandwidth) can be high, limiting the achievable maximum input signal bandwidth (because of the maximum attainable sampling frequency in a given VLSI technology). The use of a multi-bit quantizer within an SDM (i.e., a multi-bit SDM) offers wider bandwidth and higher-resolution with improved stability and reduced OSR, and therefore is desirable in wide bandwidth and high-resolution applications such as emerging video and wireless communication applications mentioned above.

Notably, however, in multi-bit SDMs, the multi-bit Digital-to-Analog Converter (DAC) within the feedback path preferably has the same linearity requirement as the overall SDM Analog-to-Digital Converter (ADC). Any non-linearity introduced in the feedback path of the SDM directly appears at the system output, without undergoing suppression provided by the feed-forward loop filter. Therefore, component mismatches in the multi-bit feedback DAC can severely limit the achievable resolution. For instance, if a three-bit SDM ADC is designed to achieve a 16-bit resolution, then the three-bit feedback DAC preferably also has 16-bit linearity (though the number of bits in the feedback DAC is three) so that it does not produce any undesirable effect on the ultimate performance. Achieving 16-bit linearity from a multi-bit DAC in digital Complementary Metal-Oxide Semiconductor (CMOS) technologies can be difficult unless expensive laser trimming or calibration techniques are used. For this reason, multi-bit SDMs are known to be very sensitive to the tolerance of standard CMOS technologies. To tackle this problem, various algorithms, which are collectively referred to as the Dynamic Element Matching (DEM) techniques, have been developed in the literature.

Several first-order DEM techniques have been proposed, such as DEM based on the random selection of unit elements in the feedback DAC, based on Individual Level Averaging (ILA), and based on Weighted Averaging (DWA). Each is described further below.

An exemplary DEM method based on the random selection of unit elements in the feedback DAC was proposed by L. R. Carley in "A noise-shaping coder topology for 15+ bit converters," *IEEE Journal of Solid-State Circuits*, vol. SC-24, pp. 267-273, April 1989, which is hereby incorporated by reference. Another exemplary DEM method, termed Individual Level Averaging (ILA), was proposed by B. H. Leung and S. Sutarja in "Multi-bit sigma-delta A/D converter incorporating a novel class of dynamic element matching techniques," *IEEE Transactions on Circuits and Systems. Analog and Digital Signal Processing, vol.* 39, pp. 35-51, January 1992, which is also hereby incorporated by reference. In the ILA approach, unlike the random DEM method, the selection of unit elements is decided with a digital logic that incorporates a memory storing the information regarding whether a particular unit element was used in the previous clock cycles or not. The memory feature of the ILA makes this method more efficient since the usage of each unit element can be made more uniform.

In the DWA technique, the unit elements are selected in a circular way, and, therefore the noise arising from the mismatches among the unit elements is spectrally shaped by a first-order high-pass transfer function. For example, the DWA approach is further discussed and proposed in an article by R. T. Baird and T. S. Fiez, entitled "Linearity enhancement of multi-bit delta-sigma A/D and D/A converters using data weighted averaging," *IEEE Transactions on Circuits and Systems: Analog and Digital Signal Processing*, vol. 42, pp. 753-762, December 1995 (which is hereby incorporated by reference). The DWA approach can provide a significant improvement over the randomization DEM and ILA techniques since the mismatch noise is spectrally shaped.

A Data Directed Scrambling (DDS) technique has also been proposed to provide a first-order spectral shaping of the mismatch errors. See, for example, U.S. Pat. No. 5,404,142, entitled "Data-directed scrambler for multi-bit noise shaping D/A converters," which is hereby incorporated by reference. The DDS approach can provide a first-order spectral shaping of the mismatch errors. In the context of SDMs, however, achieving a higher-order mismatch-shaping DEM is important because the mismatch errors introduced by the multi-bit feedback DAC can be better suppressed within the input signal bandwidth in the same manner as it is done for the quantization noise.

Several higher-order DEM techniques have been proposed, such as in U.S. Pat. No. 6,266,002, issued in July 2001 to X. M. Gong, E. Gaalaas, and M. Alexander, entitled "Second-order noise shaping dynamic element matching for multi-bit data converter;" U.S. Pat. No. 5,986,595, issued in November 1999 to C. Lyden; A. Keady, entitled "Reduction of mismatch errors for multi-bit oversampled data converters;" R. Schreier and B. Zhang, "Noise shaped multi-bit D/A converter employing unit elements," published in *Electronics Letters*, vol. 31, pp. 1712-1713, September 1995; J. Welz, I. Galton, and E. Fogleman, "Simplified logic for first-order and second-order mismatch-shaping digital-to-analog converters," *IEEE Transactions on Circuits and Systems: Analog and Digital Signal Processing*, vol. 48, pp. 1014-1028, November 2001; A. Yasuda and H. Tanimoto, in "Noise shaping dynamic element matching method using tree structure," *Electronics Letters*, vol. 33, pp. 130-131, January 1997; and A. Keady and C. Lyden, in "Tree structure for mismatch noise-shaping multi-bit DAC," *Electronics Letters*, vol. 33, pp. 1431-1432, August 1997. Each of the above references is hereby incorporated by reference.

In some cases, known conventional methods have been limited to second-order mismatch-shaping due to difficulty and complexity in the design of higher-order mismatch-shaping algorithms. In addition, the second-order mismatch-shaping can suffer from digital hardware overhead. The hardware complexity of the second-order mismatch-shaping DEMs scales exponentially with the number of unit elements in the feedback DAC. The extension of the second-order mismatch-shaping DEM to third and higher-order cases has problems due to the stability issues in the mismatch-shaping algorithm, and requires complex hardware, as described in the prior art.

Therefore, there is a need for a higher-order mismatch-shaping DEM algorithm that does not suffer from the stability problems, the hardware complexity or other problems.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In one aspect, at least some embodiments of the invention relate to multi-bit sigma-delta data converters employing dynamic element matching (DEM) in a particular way, and the corresponding methods, which can help to reduce the effects of the component mismatch errors due to the internal multi-bit quantizer.

At least some embodiments of the present invention include an effective and efficient means for a higher-order mismatch-shaping DEM that can be used in the design and implementation of multi-bit SDM data converters. In one embodiment, a DEM technique described herein is included in the feed-forward path of the SDM, rather than in the feedback path, which can provide significant advantages over prior art DEM techniques.

In one embodiment, the invention provides a sigma delta modulator (SDM) data converter system, comprising a signal path, a feedback signal path, and a multi-bit quantizer disposed in a feedforward path. The signal path receives an input signal to be processed. The feedback signal path provides a feedback signal that is subtracted from the input signal. The multi-bit quantizer is disposed in the feedforward path so as to receive the input signal after the feedback signal has been subtracted from it. Te multi-bit quantizer uses feedforward dynamic element matching (DEM) to spectrally shape mismatch errors in the SDM data conversion system and produce an output signal, wherein the output signal of the multi-bit quantizer is used for at least a portion of the feedback signal.

In one embodiment of the mismatch-shaping DEM approach described herein, the mismatch errors in the feedback DAC are spectrally high-pass filtered by the noise transfer function of the SDM. This behavior is achieved, for example, by employing analog multiplexers in the multi-bit quantizer that resides in the feed-forward loop of the SDM. Since the correction algorithm is introduced in the feed-forward loop of the SDM, the mismatch errors produced by the multi-bit feedback DAC is automatically shaped by the high-pass noise transfer function of the SDM. This is described further herein.

In one aspect, the input signal comprises an analog signal, and the feedback path further comprises a multi-bit digital to analog converter (DAC) that receives the feedback signal from the multi-bit quantizer and processes the feedback signal before providing the feedback signal to the feedforward path for subtraction from the input signal. The multi-bit quantizer can, for example, have a first predetermined number of levels, wherein the predetermined number of levels is greater than two, and wherein the multi-bit DAC has the same number of levels as the multi-bit quantizer.

In one embodiment, The SDM data conversion system can further comprise a loop filter disposed in the signal path after the feedback signal has been subtracted from the input signal and before the input signal is provided to the multi-bit quantizer, wherein the loop filter is operable to filter the signal provided to the multi-bit quantizer so as to minimize the effects of any errors on a noise shaping characteristic of the SDM data conversion system. In one embodiment, the multi-bit quantizer uses a noise transfer function of the SDM data conversion system to spectrally shape the mismatch errors. In one embodiment, the multi-bit quantizer comprises a high pass filter having an order equal to the order of the SDM data conversion system.

In one embodiment, the multi bit quantizer has a first number of levels, nlev, where nlev>2. In a further aspect of this embodiment, the multi-bit quantizer further comprises a reference voltage generator, a set of nlev-1 multiplexers, and a corresponding set of nlev-1 comparators. The reference voltage generator generates a set of reference voltages, the set comprising nlev-1 separate reference voltages, each reference voltage based at least in part on an input-output transfer characteristic of the multi-bit quantizer. Each multiplexer in the set of nlev-1 multiplexers receives the set of reference voltages and selecting one of the set of reference voltages to be provides as a respective output voltage reference signal.

Each respective comparator receives the input signal to the multi-bit quantizer as a reference signal and also receives the output voltage reference signal from a corresponding multiplexer as a comparison signal, each respective comparator producing a respective digital output signal based on a comparison between the reference signal and the comparison signal.

In one embodiment of the invention, the reference voltage generator comprises a resistive ladder circuit. In one embodiment of the invention, the reference voltage generator comprises at least one switched capacitor circuit.

In still another embodiment of the above aspect, the SDM data conversion system further comprises a reference selection circuit (RSL) providing a common digital selection input signal to each of the nlev-1 multiplexers. In one aspect, based on the value of the common digital selection input signal, each respective multiplexer selects a respective reference voltage from the set of reference voltages and provides the selected reference voltage to the respective comparator as a comparison signal. In a further aspect, a clock signal is coupled to each respective comparator, wherein each comparator performs its respective comparison of the reference signal and the comparison signal during a first portion of the clock signal and produces its respective digital output signal during a second portion of the clock signal. For example, in one embodiment, the first portion of the clock signal is the high portion of the clock signal and wherein the second portion of the clock signal is the low portion of the clock signal. In another embodiment, the RSL circuit is responsive to a clock input signal provided thereto, wherein, during the falling edge of the clock input signal, the value of the common digital selection input signal is changed.

According to one embodiment, a multi-bit SDM A/D converter may include a summing junction, which performs subtraction between the analog input signal and an analog feedback signal. The resulting signal is processed by an analog feed-forward loop filter and fed into a multi-bit quantizer, which produces a digital output sequence with low-bit resolution at a high sampling rate. The digital output of the multi-bit quantizer is converted into analog voltages by a multi-bit DAC in the feedback path, generating the analog feedback signal. The low-resolution high-sampling rate digital output signal of the multi-bit quantizer is processed by a digital low-pass filter to suppress high frequency quantization as well as mismatch noise and perform down conversion, producing a high-resolution low-rate digital output for the SDM ADC system, which is a digital, substantially faithful representation of the original analog input signal.

The SDM data conversion system of any of the above embodiments can further comprise a digital decimation filter that processes the digital output signal from the multi-bit quantizer to produce an output signal. For example, in one aspect, the multi-bit quantizer produces a low-resolution high-speed digital output signal and wherein the digital decimation filter generates a high-resolution low speed output signal. The digital decimation filter can be constructed and arranged to attenuate high frequency quantization noise caused by a non-linear quantization function of the SDM data conversion system. The digital decimation filter also can be constructed and arranged to suppress high frequency mismatch noise due to mismatches arising from the multi-bit DAC.

In another aspect, the input signal to the SDM data conversion signal is a digital signal. In a further embodiment of this aspect, the SDM data conversion system further comprises a multi-bit DAC receiving the output signal from the multi-bit quantizer, the multi-bit DAC having a predetermined nlev number of levels, where nlev>2, wherein the multi-bit DAC converts the digital output from the multi-bit quantizer into an analog signal of high frequency quantization. The SDM data conversion system can further comprise an analog low-pass filter that processes the analog signal from the multi-bit DAC to generate an analog output signal that is substantially free of noise. For example, the analog low-pass filter can be constructed and arranged to attenuate high frequency quantization noise caused by a non-linear quantization function of the SDM data conversion system. In another example, the analog low-pass filter is constructed and arranged to suppress high frequency mismatch noise.

In another aspect, the invention provides a method for converting data. An input signal to be processed is received, and a feedback signal is subtracted from the input signal. The input signal is quantized after the feedback signal has been processed. Mismatch errors in the input signal are spectrally shaped after the feedback signal has been subtracted from the input signal, by using a feedforward DEM in the quantizer. A digital output signal is produced, where the output signal is used for at least a portion of the feedback signal.

In further embodiments of this aspect, Dynamic Element Matching (DEM) is used to spectrally shape the mismatch errors. In another embodiment, the input signal that is received comprises an analog input signal, and the digital feedback signal is converted to an analog signal. In another embodiment, the input signal is integrated after the feedback signal has been subtracted from the input signal and before the input signal has been quantized, wherein the integrating of the input signal minimizes at least some errors in the input signal. In a further embodiment, a noise transfer function is used to spectrally shape the mismatch errors.

In still another embodiment of this aspect, the quantization is accomplished with an nlev-1 number of levels, where nlev>2. In a further embodiment, a set of nlev-1 reference voltages is generated, at least one of the nlev-1 reference voltages is selected in accordance with a predetermined condition, at least one of the nlev-1 reference voltages is compared to the input signal after the feedback signal has been subtracted from the input signal, and a digital output signal is generated based on the comparison.

The reference voltage can be selected during a cycle of the clock signal, such as during at least one portion of the clock signal (e.g., a rising or falling edge, a high portion, a low portion, etc.). The predetermined condition for selecting the reference voltage can be changed in response to a portion of the clock signal.

In yet another embodiment, the invention provides a sigma delta modulator (SDM) data conversion system, comprising means for receiving an input signal to be processed; means for subtracting a feedback signal from the input signal; and means for using feedforward dynamic element matching (DEM) to spectrally shape mismatch errors in the SDM data conversion system and producing an output signal, wherein the output signal of the multi-bit quantizer is used for at least a portion of the feedback signal. Aspects of this embodiment can further comprise means for using DEM to spectrally shape the mismatch errors without incurring additional delay in the feedback signal, and/or means for using a noise transfer function of the SDM to spectrally shape mismatch errors in the SDM data conversion system.

At least some of the embodiments described herein have one or more advantages: For example, one advantage is that higher-order spectral shaping of the mismatch errors can be easily achieved. Another advantage is that, since the DEM is performed inside the multi-bit quantizer, the errors arising from the threshold voltage variations of the comparators are also averaged out. Still another advantage is that the delay introduced by the DEM algorithm is significantly lower in with at least some embodiments of the invention as compared to the feedback DEM approaches as cited above and as further described herein. This can be especially important in high-speed continuous-time implementations, where the additional delay introduced by the DEM logic may either limit the maximum achievable sampling frequency or cause instability.

In addition, because the correction algorithm is introduced in the multi-bit quantizer, the errors arising from the mismatches among the unit elements of the feedback DAC are spectrally shaped by the noise transfer function of the SDM in the same way as the quantization noise is shaped. In this way, the contribution of the mismatch errors are made small in the pass-band of the SDM, while they are amplified at higher frequencies that are out of interest. Thus, in at least some embodiments of the invention described herein, the order of the mismatch-shaping in the present invention is equal to the order of the SDM. Advantageously, at least some of the embodiments of the invention provide a higher-order mismatch-shaping action at virtually no additional hardware cost.

In high-speed continuous-time implementations of at least some SDM ADC systems implemented in accordance with the invention, the additional delay incurred in the feedback loop, by the conventional feedback DEM methods (as cited above), usually limits the maximum achievable sampling frequency and the input signal bandwidth. In at least some embodiments of the invention described herein, however, the DEM circuit is included in the feed-forward path of the SDM, helping to eliminate the need for additional DEM circuits in the sensitive feedback path. Consequently, no additional delay is incurred in the feedback path of the SDM. This advantage of this embodiment of present invention makes it particularly suitable in high-speed continuous-time implementations of the SDM ADCs.

Advantageously, at least some of the embodiments described herein average out the mismatches in the offset voltages of the comparators that arise from the fabrication imperfections, which is an added benefit of employing the DEM inside the quantizer.

Details relating to this and other embodiments of the invention are described more fully herein.

BRIEF DESCRIPTION OF THE DRAWINGS

The advantages and aspects of the present invention will be more fully understood in conjunction with the following detailed description and accompanying drawings, wherein.

In the drawings, like reference numbers indicate like elements, and like or related elements will have like or related alpha, numeric or alphanumeric designators.

DETAILED DESCRIPTION

Figure 1A:
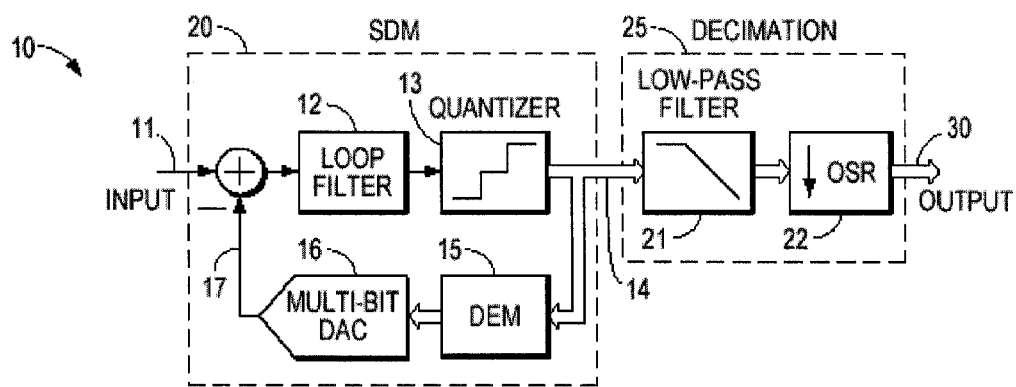
FIG. 1A is an illustrative block diagram of a prior art SDM ADC system.

FIG. 1A is an illustrative block diagram of a prior art SDM ADC system, showing a top-level architecture for an SDM ADC system 10. An analog input signal 11 in an SDM 20 is subtracted from an analog feedback signal 17, and then processed by an analog feed-forward loop filter 12 before being fed into a multi-bit quantizer 13. The loop filter 12 (which can, for example, be an integrator) filters the resultant signal so as to minimize the effect of the error signal on a noise-shaping characteristic of the SDM 200. The multi-bit quantizer produces a low-resolution high-speed digital signal 14, which is converted in the feedback loop into the analog domain by a multi-bit feedback DAC 16. A digital decimation filter 25 processes the low-resolution and high-speed digital output from the multi-bit quantizer to produce a high-resolution low speed digital signal 30 at the output of the SDM ADC system.

Still referring to FIG. 1A, the analog input signal 11 to the SDM ADC system 10 has a predetermined bandwidth fb. The SDM 20 is clocked at a much higher sampling rate than the input signal bandwidth, which is determined by fs=2fb*OSR, where OSR is the oversampling ratio. The multi-bit quantizer 13 in SDM ADC 10 has a much smaller resolution than the target resolution of the system. For instance, the multi-bit quantizer can have a two-bit, three-bit, and in some cases five-bit resolution, where the overall ADC system might have more than 16-bit resolution. The present quantization noise is spectrally shaped by the noise transfer function of the SDM 20 due to the feedback action so that its power spectral density is suppressed within the input signal bandwidth while it is amplified outside the bandwidth of interest. Hence, filtering out the high frequency quantization noise is advantageous.

A decimation filter 25, which is composed of a low-pass filter 21 followed by a down sampler 22, is used to further process the low-resolution high-speed digital output of the multi-bit quantizer 13. The low-pass filter 21 cuts off the quantization noise, and the down sampler 22 reduces the sampling rate of the output signal to the Nyquist rate of the input signal (i.e., 2 fb). While decimation filter 25 is conceptually composed herein of a low-pass filter 21 followed by a down sampling operation 22, in real implementations the realization of low-pass filtering may be performed in several stages, allowing the down sampling operation to be performed partially at each stage. Design details for decimation filters are known to those of skill in the art, and are described, for example, by S. Norsworhty, R. Schreier, and G. Temes, in "Delta-Sigma Data Converters: Theory, Design, and Simulation," published in 1997 by the IEEE Press in New York, which is hereby incorporated by reference.

Figure 1B:
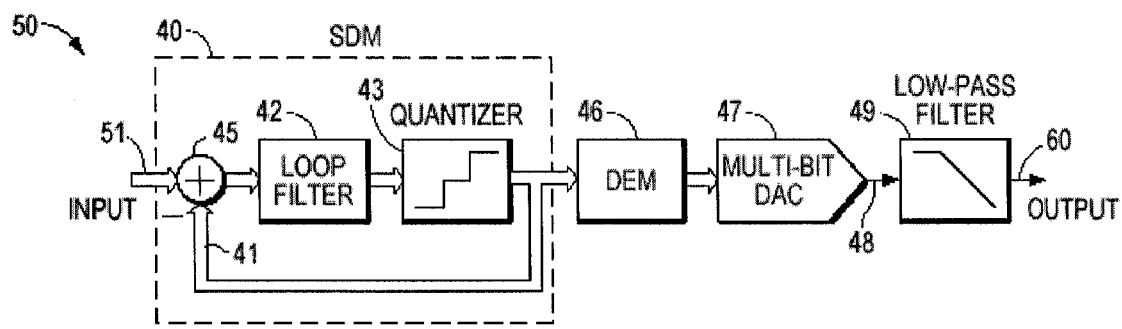
FIG. 1B is an illustrative block diagram of a prior art SDM ADC system.

FIG. 1B is an illustrative block diagram of a prior art SDM DAC system 50, illustrating a top-level architecture for an SDM DAC system 50. In SDM DAC system 50 a digital input signal 51 is subtracted from a digital feedback signal 41, and then processed by a digital feed-forward loop filter 42 before being fed into a multi-bit quantizer 43. The multi-bit quantizer 43 produces a low-resolution high-speed digital signal 41, which is directly fed back to the summing junction 45 as the digital feedback signal. A multi-bit DAC 47 then converts the output of the multi-bit quantizer into an aalog waveform 48. An analog reconstruction filter 49 processes the noisy analog output waveform of the multi-bit DAC to generate a clean analog signal 60 (i.e., an analog signal that is substantially free of noise) at the output of the SDM DAC system 50.

Figure 2:
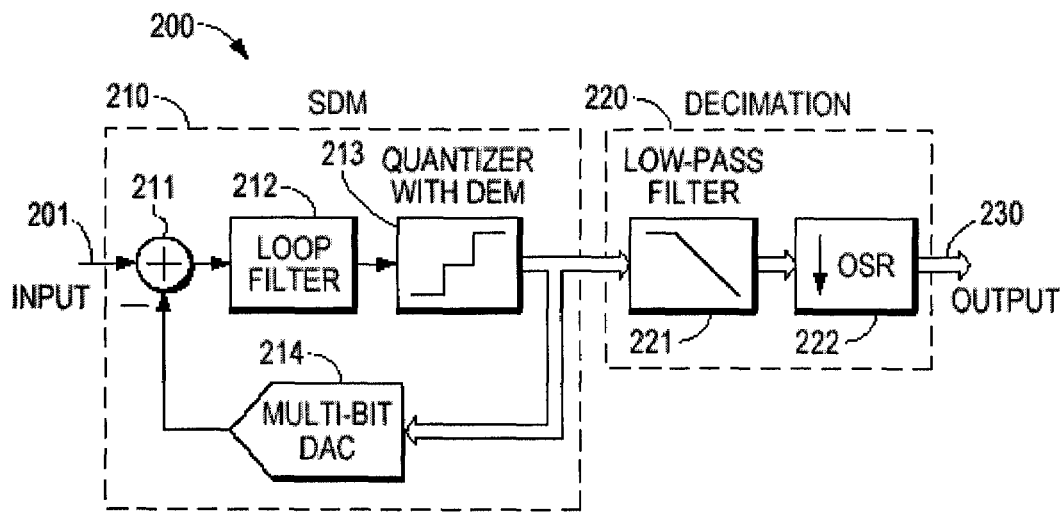
FIG. 2A is a block diagram of a top-level architecture for a general SDM ADC system employing dynamic element matching (DEM), in accordance with a first embodiment of the invention.
FIG. 2B is a block diagram of a top-level architecture for a general SDM DAC system employing DEM, in accordance with a second embodiment of the invention.
Figure 2B:
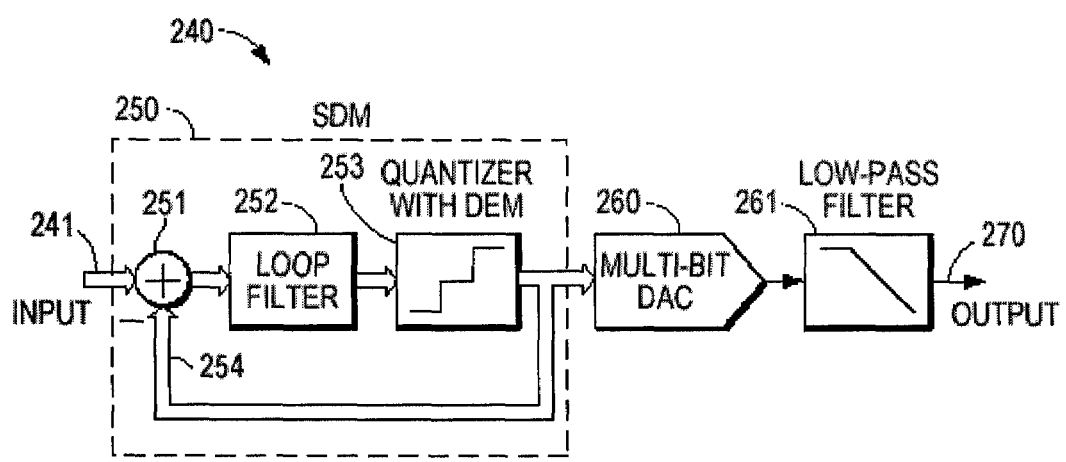

According to one embodiment of the invention, prior art SDM ADC system 10 and/or SDM DAC system 50 are modified to employ a novel mismatch-shaping dynamic element matching (DEM). At least some embodiments of the present invention employ analog multiplexers in the multi-bit quantizer that resides in the feed-forward loop of the SDM, as shown in FIGS. 2A and 2B (which are described further herein). These embodiments spectrally high-pass filter the mismatch errors in the feedback DAC utilizing the noise transfer function of the SDM. These embodiments are described below in connection with FIGS. 2A and 2B.

Prior art systems such as those shown in FIGS. 1A and 1B use the dynamic element matching (DEM) algorithm in the feedback path of the analog SDM (FIG. 1A) and outside the digital SDM (FIG. 1B). Essentially, a DAC is composed of identical unit elements whose individual outputs are summed together without any weighting to produce an analog voltage waveform with a finite set of discrete levels. The unit elements can be current sources, capacitors, or resistors depending on the details of the implementation. After the fabrication of the circuit, because of random and static variations in the process parameters, each unit element will have a different value than its nominally designed value, giving rise to a mismatch among the output discrete levels. For this reason, prior art methods are implemented with a DEM algorithm preceding the multi-bit DAC, where the DEM dynamically chooses which unit elements will be used at each clock cycle to represent a particular output level. The value of a particular output discrete level is dependent on how, but not which, unit elements are used; therefore, DEM methods take this redundancy advantage to reduce the effect of the component mismatches without actually knowing the degree of the mismatches among the unit elements.

The embodiments described herein depart from the above-described prior art approaches, although some embodiments of the invention described herein may be adapted to work with and/or improve the existing state of art, where compensation of the mismatch errors is achieved by exploiting the redundancy in the hardware of the feedback DAC, in which a number of scalar unit elements (e.g., one bit) are used to implement a multi-bit DAC by summing the individual outputs of the unit elements.

At least some of the embodiments of the invention described herein enable a higher-order mismatch-shaping DEM algorithm that is less likely to suffer from problems such as stability and hardware complexity problems.

FIG. 2A is a block diagram of a top-level architecture for a general SDM ADC system 200 employing dynamic element matching (DEM), in accordance with a first embodiment of the invention, and FIG. 2B is a block diagram of a top-level architecture for a general SDM DAC system 240 employing DEM, in accordance with a second embodiment of the invention. The SDM ADC system 200 and SDM DAC system 240 each provide improvements over the prior art in several ways. For example, one improvement includes using the dynamic element matching (DEM) inside the multi-bit quantizer. That is, FIGS. 2A and 2B operate in a general manner similar to the systems shown in FIGS. 1A and 1B, respectively, but the systems of FIGS. 2A and 2B employ DEM inside the multi-bit quantizer. When the DEM is inside the multi-bit quantizer, the reference voltages to the comparators are dynamically rotated at each clock cycle under the control of reference selection logic. Many different speeds of clock are usable with the invention, as those of skill in the art will appreciate; the only limiting factor on the usable clock speed/frequency is the speed of transistors used during fabrication of the components making up the SDM system 200.

According to another embodiment, illustrated in FIG. 2B, a multi-bit SDM DAC system 240 includes a digital adder 251 that calculates the difference between a digital input signal 241 and a digital feedback signal 254. The resulting signal is processed by a digital feed-forward loop filter 252 and fed into a multi-bit digital truncation block 253 that generates a low-resolution digital signal at a high sampling rate. The output of the multi-bit truncation block 253 is directly fed back as the digital feedback signal 254. The output of the truncation block 253 is converted to the analog domain using a multi-bit DAC 260. An analog reconstruction filter 261 processes the analog output voltage of the multi-bit DAC 260 to suppress high frequency truncation and mismatch noise, generating a faithful analog representation 270 of the original digital input signal 241. In this case, the feed-forward DEM method, which is implemented in at least some embodiments of the invention, is employed in the multi-bit truncation block in a similar way as that explained for the SDM ADC case, except that the analog multiplexers are replaced with digital multiplexers.

As described herein, the mismatch noise from the multi-bit DAC in both systems is spectrally shaped by the noise transfer function of the respective SDMs 210 and 250. The order of the mismatch-shaping is equal to the order of the SDM, thus allowing the achievement of a higher-order mismatch-shaping without requiring use of more complicated mismatch-shaping DEM methods. For example, in one embodiment of the present invention, the DEM method used in the first multi-bit quantizer 213 of FIG. 2A and the second multi-bit quantizer 253 of FIG. 2B is a comparatively simple first-order mismatch-shaping logic. However, the principles of the invention are not limited to this particular DEM method. As those of skill in the art will appreciate, any appropriate DEM circuit or method, even so-called "sophisticated" methods, can be successfully utilized inside the multi-bit quantizer without departing from the spirit and scope of the invention, and the various embodiments shown and described herein constitute only demonstrative examples.

Figure 3A:
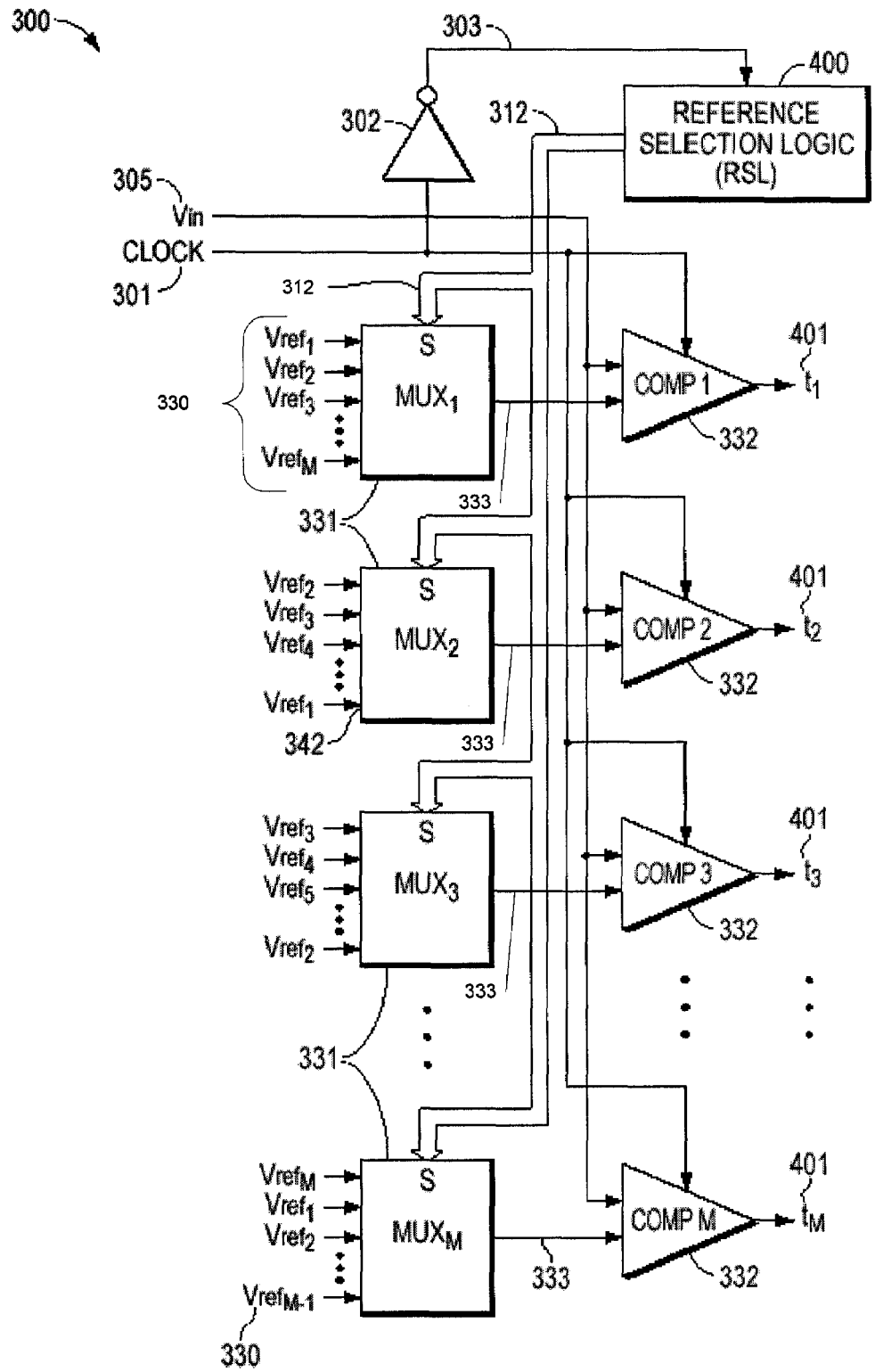
FIG. 3A is a block diagram illustrating one embodiment of the multi-bit quantizer with DEM that can be used with either or both of the embodiments shown in FIGS. 2A and 2B.

FIG. 3A is a block diagram illustrating one embodiment of a multi-bit quantizer 300 with DEM that can be used with either or both of the embodiments shown in FIGS. 2A and 2B. Referring to FIG. 3A, the number of levels of the quantizer is indicated as nlev. The quantizer 300 consists of M separate comparators 332M and equal number of multiplexers 331M, where M is equal to nlev minus one (i.e., M=nlev-1). For instance, for a three-bit and four-bit quantizer, nlev=8 and nlev=16, and thus M=7 and M=15, respectively. A reference voltage generation circuit (not shown in FIG. 3A), such as the resistive ladder network 320 of FIG. 3B (described further herein) or the switched capacitor circuit 350 of FIG. 3C (described further herein) generates a set of M different reference voltages 330 to the comparators 332M, according to the input-output transfer characteristic of the multi-bit quantizer. Such input-output characteristics of quantizers, which include but are not limited to stair-case like functions, are well known to those of skill in the art. The operation of the quantizer 300 with DEM is as follows:

Referring to FIG. 3A, each of the M comparators 332M produces a logic "one" output if its input voltage $V_{in}$ 305 is greater than or equal to its reference input 333, otherwise it produces a logic "zero." The input voltage to the multi-bit quantizer, $V_{in}$ 305, is applied to each of the comparators 332M as an input voltage. The output 333 of each multiplexer 331M is connected to the respective comparator 332M as a reference input for comparison with $V_{in}$ 305. During the high cycle of the clock 301 signal, each comparator 332M performs a comparison between $V_{in}$ 305 and its reference input 333 and produces a digital output 401M, which is being held constant during the low cycle of the clock 301. Each comparator 332 includes a standard latching circuit (not shown) to hold its value constant after the clock 301 signal transitions from high to low. Multiplexer circuits 331M are included in the multi-bit quantizer 300 to dynamically rotate the reference voltages 333M to each respective comparator 332M. Each multiplexer circuit 331M receives a set of M reference inputs 330. A digital control signal S (indicated by lines 312 in multi-bit quantizer 300) is provided to each multiplexer circuit 33M from the reference selection logic (RSL) 400. Each multiplexer 331 chooses among its respective M separate reference inputs 330 according to the binary value of the S signal 312, to provide its respective output 333 to the respective comparator 332 as a respective reference signal 333. For instance, when S 312 is equal to zero and one, each multiplexer 331 chooses the voltage that is connected to its respective second reference input $V_{ref2}$.

Figure 3B:
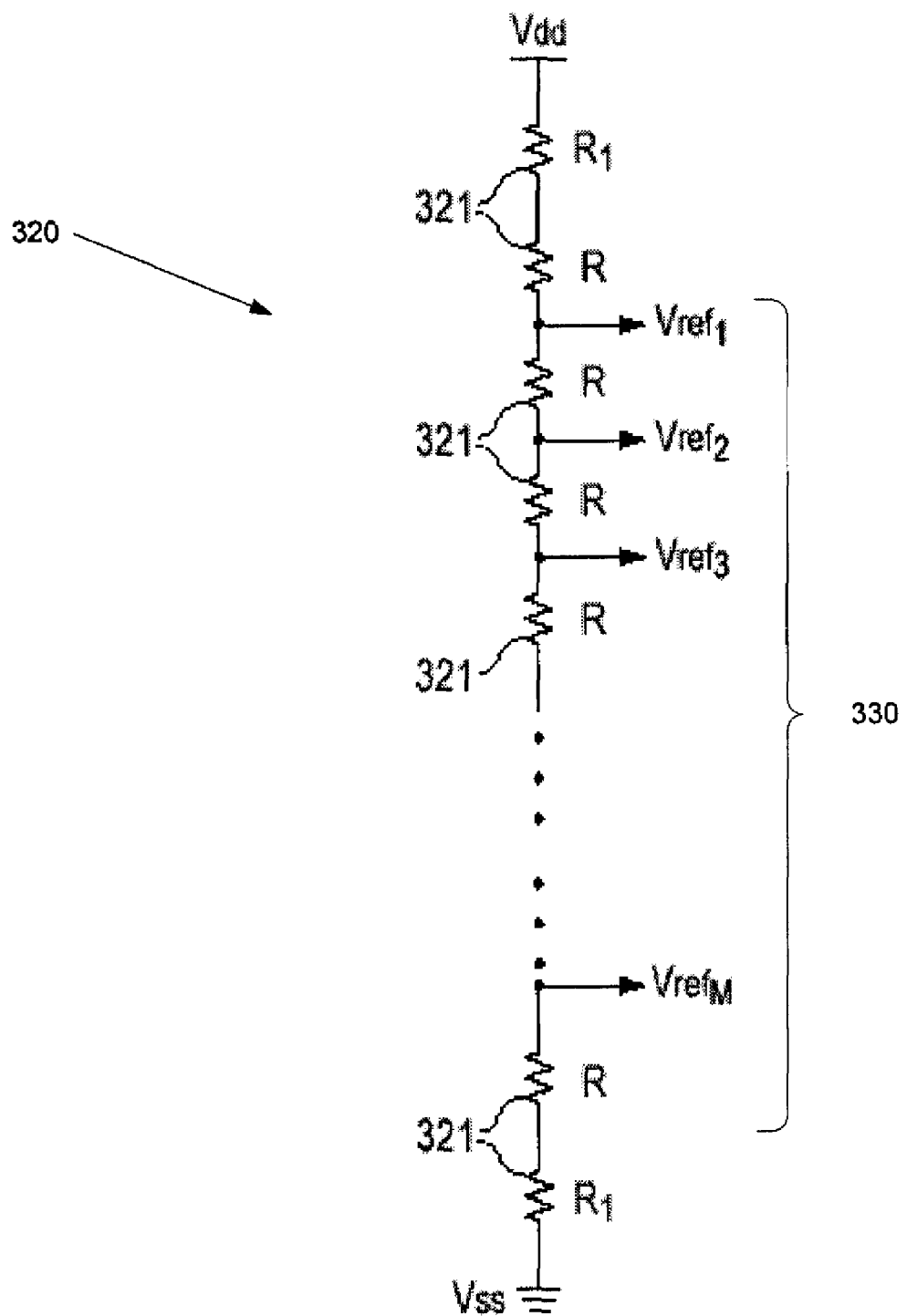
FIG. 3B is a block diagram for a first reference voltage generation circuit for the multi-bit quantizer with DEM of FIG. 3A, using a resistive ladder implementation, in accordance with one embodiment of the invention.
Figure 3C:
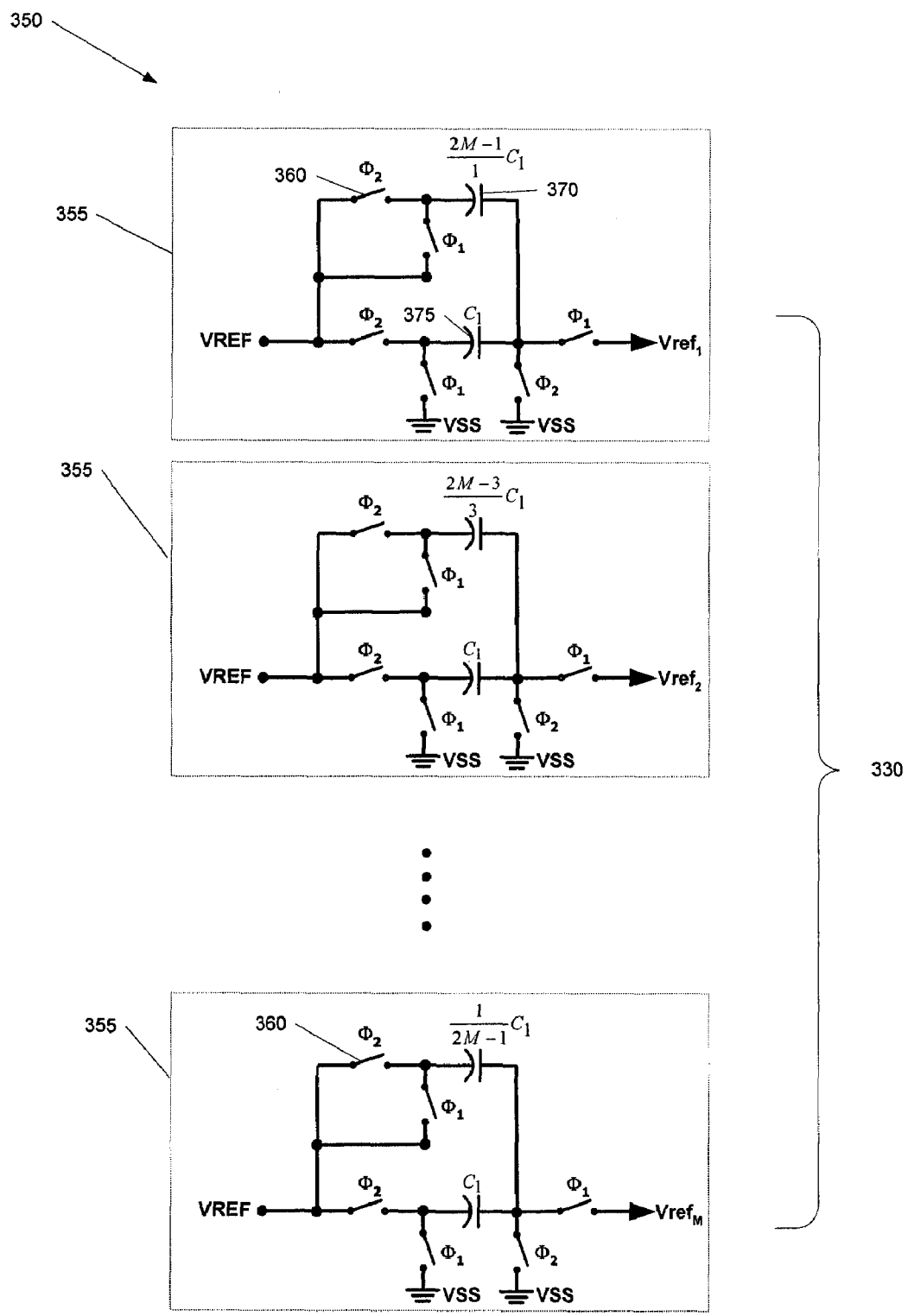
FIG. 3C is a block diagram for a second reference voltage generation circuit for the multi-bit quantizer with DEM of FIG. 3Z, using a switched capacitor implementation, in accordance with one embodiment of the invention.

In accordance with at least some embodiments of the invention, there are various ways for the multi-bit quantizer 300 to generate its reference voltages. FIGS. 3B and 3C provide two illustrative examples of circuits that are included as part of two different embodiments of the multi-bit quantizer 300, to generate reference voltages. As those of skill in the art will appreciate, however, the reference generation circuits shown in FIGS. 3B and 3C also can be implemented separate from the multi-bit-quantizer 300 so as to be operably coupled to the multi-bit quantizer 300.

For example, in a first embodiment of the multi-bit quantizer 300, a resistor ladder 320 generates the set of M different reference voltages 330, $V_{ref1}$, $V_{ref2}$, ..., $V_{refM}$, which are applied to each multiplexer 331 (FIG. 3A) with a different order. However, those of skill in the art will appreciate that any form of appropriate reference-generating circuit (for instance, a capacitive ladder network/circuit) could be used herein without departing from the spirit and scope of this invention. In one embodiment, the reference voltages to the comparators may be shuffled at each clock cycle of the sampling signal according to a DEM algorithm. At each clock cycle of the sampling signal, the DEM algorithm decides which reference voltage will connect to which one of the comparators. Reference voltages 330 to the multiplexer 331 ($MUX_1$) are, as an example in this embodiment and without limitation to other possible arrangements, connected in the following order:

$$\{Vref1, Vref2, \ldots, VrefM-1, VrefM\},$$

while the reference voltages 330 to the multiplexer 331 ($MUX_2$) are connected in order of:

$$\{Vref2, Vref3, \ldots, VrefM, Vref1\},$$

and so on for the remaining multiplexers 331.

Hence, in the illustrative multi-bit quantizer with DEM 300 of FIG. 3A, each respective multiplexer 331 has a unique arrangement of the reference voltages 330 at its inputs.

The block diagram and schematic of FIG. 3B illustrate just one possible implementation of the resistive ladder version of the multi-bit quantizer 300. It should be apparent to those of skill in the art that there can many ways to generate reference voltages to the comparators 332 without departing from the spirit and scope of the invention as described herein. FIG. 3B is provided merely as an example for the utilization of the feedforward DEM approach in the context of the resistive ladder realization of the multi-bit quantizer 300, and it is not meant to provide specific limiting details for the invention.

In another embodiment of the invention, the reference voltages for the multi-bit quantizer 300 of FIG. 3A are implemented using the switched-capacitor technique as shown in FIG. 3C. Referring to FIG. 3C, a switched-capacitor array 350, with M independent switched-capacitor elements 355 (also referred to herein as switched capacitor circuits 355), is used to generate the set of M reference voltages 330 to the comparators 332 (FIG. 3A). Each switched-capacitor element 355 consists of six switches 360, an upper capacitor 370, and a lower capacitor 375. The switches 360 are being controlled by non-overlapping clocks, dubbed as $\Phi_1$ (phi1) and $\Phi_2$ (phi2).

Figure 3D:
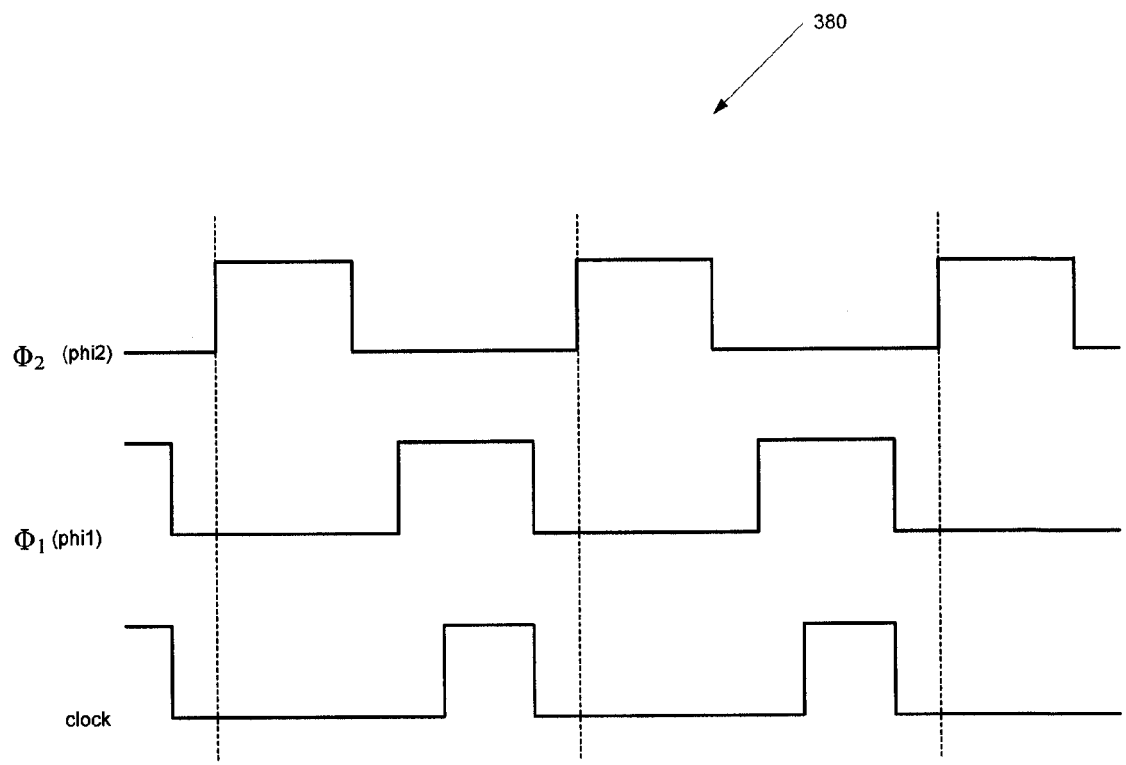
FIG. 3D is a clock timing diagram for the second reference voltage generation circuit of FIG. 3C.

The operation of the switched-capacitor element 355 is as follows. During the high cycle of the clock signal $\Phi_2$ (phi2), the negative terminals of the lower capacitor $C_1$ 375 and the upper capacitor 370 (whose value is changing depending of the location of the switched-capacitor element within the switched-capacitor array 355) are charged to the input reference voltage, VREF, while their positive terminals are tied to (analog) ground. On the high cycle of $\Phi_1$ (phi1), the negative terminal of the lower capacitor ($C_1$) 375 is connected to (analog) ground, whereas the negative terminal of the upper capacitor 370 is connected to VREF. The desired reference voltage to a comparator 332 (FIG. 3A) is generated at the positive terminal of the capacitors 370, 375 during the high cycle of $\Phi_1$ (phi1). Since the set of reference voltages ($Vref_1$, $Vref_2$, ..., $Vref_M$) 330 is valid only during the high cycle of $\Phi_1$ (phi1), the comparators 332 (FIG. 3A) are comparing the input signal $V_{in}$ 305 (FIG. 3A) with the generated reference voltages 330 during the high cycle of the clock signal 301 (FIG. 3A), where the clock signal 301 (FIG. 3A) is in-phase with $\Phi_1$ (phi1) signal. The detailed timing information between $\Phi_1$ (phi1), $\Phi_2$ (phi2), and clock signal 301 is illustrated further in FIG. 3D.

Referring to again FIG. 3C, the value of the generated reference voltages $Vref_k$ (k=1, 2, ..., M) depends on the ratio of the values of the upper capacitor 370 and the lower capacitor 375. The value of the lower capacitor 375 in all switched-capacitor elements 355 is constant. However, as FIG. 3C illustrates, the value of the upper capacitor 370 in a given switched-capacitor element 355 is altered depending on the location of that switched-capacitor element 355 within the switched-capacitor array 350. For example, in the block diagram of FIG. 3C, the value of the upper capacitor 370 is equal to:

$$C_2 = \frac{2M - 2k + 1}{2k - 1} C_1,$$

where k=1, 2, . . . M. This leads to a reference voltage $Vref_k$ given by:

$$Vref_k = -VREF \frac{2k - 1}{2M}.$$

For instance, for k=1 and k=2 the value of the upper capacitor 370 is chosen as $C_2=(2*M-1)*C_1$ and $C_2=(2*M-3)/3*C_1$, respectively.

The block diagram and schematic of FIG. 3C illustrate just one possible implementation of the switched-capacitor version of the multi-bit quantizer 300. It should be apparent to those of skilled in the art that there can many ways to generate reference voltages to the comparators 332 (for instance, by changing the switch configuration and/or capacitor ratios) without departing from the spirit and scope of the invention as described herein. FIG. 3C is provided merely as an example for the utilization of the feedforward DEM approach in the context of the switched-capacitor realization of the multi-bit quantizer 300, and it is not meant to provide specific limiting details for the invention.

In at least some embodiments, the DEM algorithm for the multi-bit quantizer 300 is implemented using a digital control logic circuit, which in at least some of these embodiments comprises a circuit that is hereinafter referred to as the reference selection logic (RSL), and a plurality of analog multiplexers. The output of the reference selection logic (RSL) is connected to each one of the analog multiplexers as the selection input. Other inputs of the analog multiplexer constitute the analog reference voltages generated by the resistive ladder. Two different RSL circuits can be used to produce the selection signal to the analog multiplexers. In one embodiment of the digital control logic circuit, the selection of the reference voltages is made randomly in response to a pseudo-random number generator. In another embodiment of the digital logic control circuit, the reference selection signal is obtained using a data dependent algorithm, which cyclically selects the reference voltages. Both of these types of RSL circuits are included herein as exemplary embodiments, and it should be apparent to those skilled in the art that any appropriate logic circuit can be used. Referring again to FIG. 3A, the RSL circuit 400 produces a selection signal S 312 to each respective multiplexer 331, where, in this exemplary embodiment, selection signal S is allowed to change only on the falling edge of the clock 301 signal. This behavior is the reason that the inverter 302 is included in multi-bit quantizer 300 and which generates the clocking signal 303 for the RSL circuit 400. In other embodiments of the invention, the selection signal S 312 is based on another trigger other than the clock signal. For example, in one embodiment of the invention, the RSL circuit 400 includes a pseudo random number generator that generates a selection signal S 312 to be sent to each multiplexer. Any signal is usable as a trigger, in accordance with at least some embodiments of the invention, so long as the selection signal is not allowed to change when the comparators 332 are making their comparison decision. That is, when the clock or other signal to the comparators 332 is high, the trigger for the selection signal S 312 is low.

In the embodiment of FIG. 3A, on the falling edge of the clock signal 301, a new S 312 is set by the RSL circuit 400, thereby causing each respective multiplexer 331 to choose a different respective reference voltage from the set 330 of reference voltages. At this time, the comparators 332 have settled from the previous clock cycle, and their respective outputs 401 are held constant even as the respective reference inputs 333 to the respective comparators 332 are changing. Therefore, the reference voltages 333 to the comparators 332 have an ample amount of time to settle to new values before a new clock cycle begins at the next rising edge of the clock signal 301.

Figure 4:
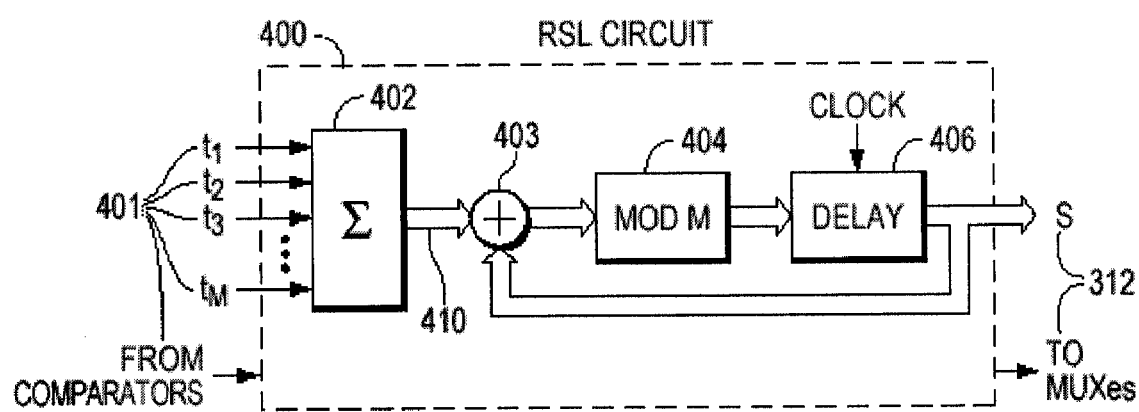
FIG. 4 is a block diagram illustrating the details of one embodiment of the reference selection logic (RSL) depicted in FIG. 3A.

FIG. 4 is a block diagram illustrating one embodiment of reference selection logic (RSL) circuit 400 that can be used with the multi-bit quantizer with DEM 300 of FIG. 3A. It should be understood that many different types of reference selection logic are usable with the invention, and that the particular implementation illustrated in FIG. 4 is merely exemplary and not limiting. Referring now to FIGS. 3A and 4, in the RSL circuit 400, the output 401 of each comparator 332 is fed back to the RSL circuit 400 to produce a digital summation signal 410 through the summation 402. The summation signal 410 is accumulated onto itself at 403 generating a multi-bit control signal S 312 for the multiplexers 331. Because of the limited number of reference voltages, a mathematical modulo M 404 operation is included inside the accumulator so as to ensure that S is always between zero and M−1. The delay element 406 inside the digital accumulator is clocked with the inverted clocking signal 303 from the multi-bit quantizer with DEM 300.

Figure 5:
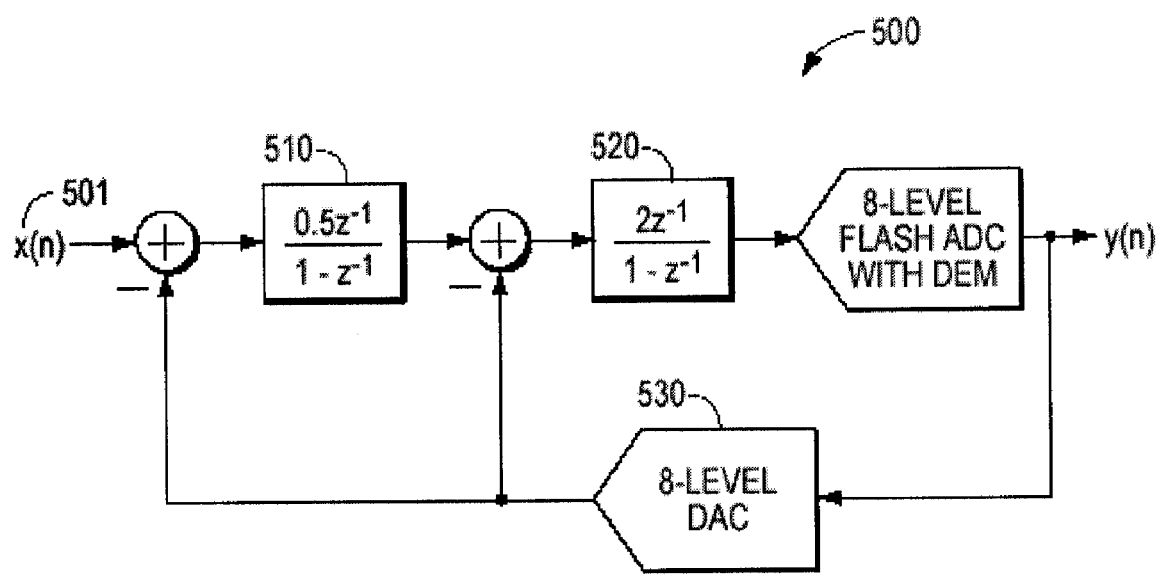
FIG. 5 is an illustrative a block diagram for a second-order three-bit SDM, in accordance with one embodiment of the invention.

FIG. 5 is an illustrative block diagram of a second-order three-bit SDM 500, in accordance with one embodiment of the invention. The SDM 500 is constructed using first and second cascaded discrete-time integrators 510 and 520 with a gain of 0.5 in integrator 510, and 2 in integrator 520, respectively (the gains listed for the first integrator 510 and second integrator 520 are provided by way of example and are not limiting). The SDM 500 has been simulated with MATLAB/SIMULINK simulation software (available from The Mathworks, Natick, Mass.) at the behavioral level to illustrate the effectiveness of the SDM 500, in accordance with one embodiment of the invention. In the simulations, a −6 dBFS (dB full relative to full scale) single-tone sinusoidal input signal is applied to the SDM 500 at a frequency of fs/256, where the OSR=100.

It should also be noted that the SDM shown in FIG. 5 is incorporated here merely for illustrative purposes. In reality, SDMs can be built using different topologies and/or architectures. For instance, four major topologies that are extensively used to build SDMs are; (i) Cascade of Integrators with Distributed Feedback (CIFB), (ii) Cascade of Integrators with Feed-forward summation (CIFF), (iii) Cascade of Resonators with Distributed Feedback (CRFB), (iv) Cascade of Resonators with Feed-forward summation (CRFF). In addition to these, multi-stage noise-shaping (MASH) type SDMs are also sometimes used. Another useful realization of SDMs, which is particularly attractive in DAC applications, is the so-called error-feedback topology. It is important to note that the quantizer-with-feedforward-DEM approach presented in this invention is equally applicable for any of these topologies that are suitable to realize SDMs. For reference to these topologies, for instance, the book by S. Norsworhty, R. Schreier, and G. Temes, entitled as "Delta-Sigma Data Converters: Theory, Design, and Simulation," published in 1997 by the IEEE Press in New York, is incorporated herein.

Figure 6A:
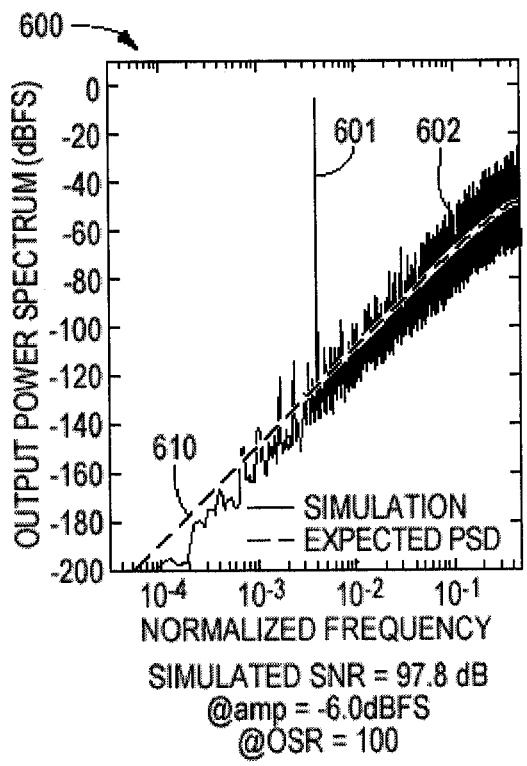
FIG. 6A shows a first set of MATLAB simulation results, done with 0% mismatch and without DEM, obtained from a simulation of the second-order SDM of FIG. 5.

FIG. 6A shows a first set of MATLAB simulation results obtained from a simulation of the second-order SDM 500 of FIG. 5. Referring to FIGS. 5 and 6A, the simulation of FIG. 6A plots the simulation result for a so-called "ideal case" of the second order three-bit SDM 500 of FIG. 5, where 0% mismatch is introduced and the DEM inside the quantizer is deactivated. The tall spectral peak 601 in FIG. 6A is the input signal 501, and the second-order high-pass filtered quantization noise 602 is also clearly visible about the line 610. The line 610 represents the theoretical noise transfer function of the SDM, and therefore the shape of the quantization noise is expected to follow the red line. In FIG. 6A, the signal-to-noise (SNR) ratio measured from this simulation set-up is approximately 98 dB.

Figure 6B:
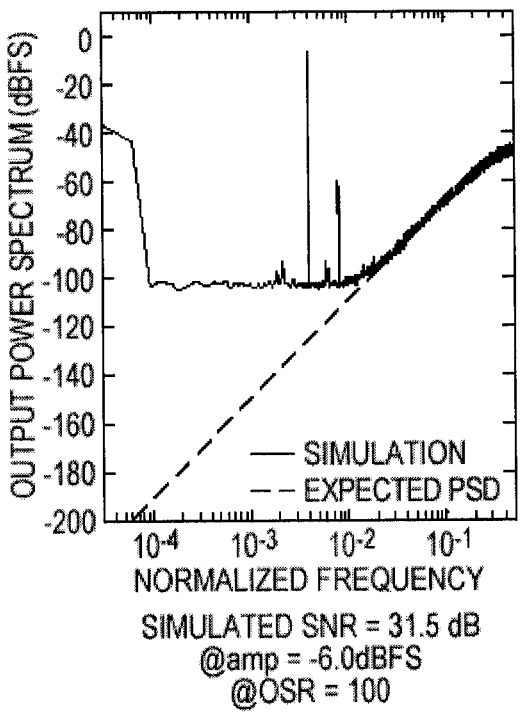
FIG. 6B shows a second set of simulation results, done with 0.5% mismatch and without DEM, obtained from a simulation of the second-order SDM of FIG. 5.

FIG. 6B shows a second set of simulation results, done with 0.5% mismatch and without DEM, obtained from a simulation of the second-order SDM 500 of FIG. 5. Essentially, FIG. 6B depicts the same SDM simulation scenario as FIG. 6A, but this time a 0.5% linear gradient mismatch is artificially included in the feedback DAC 530. As shown in FIG. 6B, the SNR reduces to 31.5 dB, and noise floor significantly rises with the addition of extra harmonic oscillations at DC and higher frequencies. Clearly, it is shown that even a small degree of mismatch (such as 0.5%) significantly reduces the performance of multi-bit SDMs.

Figure 6C:
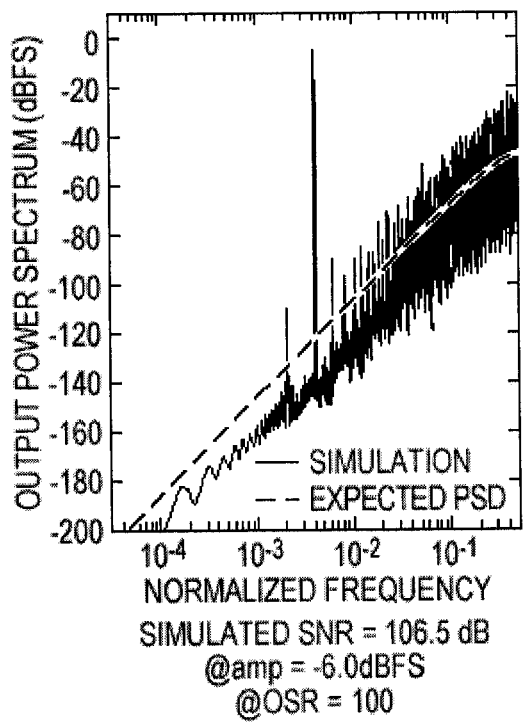
FIG. 6C shows third set of simulation results, done with 0.5% mismatch and with feed-forward DEM, obtained from a simulation of the second-order SDM of FIG. 5.

FIG. 6C shows third set of simulation results, done with 0.5% mismatch and with feed-forward DEM, obtained from a simulation of the second-order SDM of FIG. 5. To be more specific, FIG. 6C depicts the same simulation scenario as FIGS. 6A and 6B, but with 0.5% mismatch and the DEM activated inside the quantizer. The graph of FIG. 6C shows a large improvement compared the curve shown in FIG. 6B, as the signal-to-noise ratio (SNR) increases beyond that of the "ideal case" (FIG. 6A) due to the additional mismatch-shaping transfer function and dithering effect of the DEM. Based on the results of the simulations shown in FIGS. 6A-6C, it is believed that at least some embodiments of the invention provides an efficient and effective way of shaping the mismatch noise in the multi-bit SDMs, allowing the achievement of practically ideal performance levels obtained without any mismatches.

As those of skill in the art will appreciate, one or more of the embodiments described herein can be adapted to utilize and/or work with the teachings of one or more of the references incorporated by reference herein, including but not limited to references and teachings related to DEM based on the random selection of unit elements, Individual Level Averaging (ILA), Data Weighted Averaging (DWA), Data Directed Scrambling (DDS), second order noise shaping, noise shaping DEM and/or mismatch noise shaping using tree structures, and the like.

Although the embodiments of the invention described herein have been illustrated is electronic elements in hardware, those of skill in the art will appreciate that one or more embodiments of the invention may be realized wholly or partially in software, in a computer-readable medium, and/or in a transmission medium, any of which may be combined with each other and/or with hardware. For example, software embodying the present invention, in one embodiment, resides in an application running on a general-purpose computer system. In at least one embodiment, the present invention is embodied in a computer-readable program medium usable with the general-purpose computer system, such as a compact disk, USB drive, optical drive, or other computer-readable media. In addition, in one embodiment, the invention is embodied in a transmission medium, such as one or more carrier wave signals transmitted between the general purpose computer system and another entity, such as another computer system, a server, a wireless network, etc.

Throughout this document, unless the context provides a clear contrary indication, it is intended that individual circuit elements as described may be singular or plural in number. For example, the terms "circuit" and "circuitry" may include either a single component or a plurality of components, which are either active and/or passive and are connected or otherwise coupled together to provide the described function. Further, the terms "pulse" and "signal" may refer to one or more currents, one or more voltages, or a data signal. Also, although the embodiments of the invention have been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed. Moreover, the embodiments described herein may be used to implement all or a portion of a signal path or loop path in another device or system.

In describing the embodiments of the invention illustrated in the figures, specific terminology (e.g., language, phrases, terms, etc.) is used for the sake of clarity. These names are provided by way of example only and are not limiting. The invention is not limited to the specific terminology so selected, and each specific term at least includes all grammatical, literal, scientific, technical, and functional equivalents, as well as anything else that operates in a similar manner to accomplish a similar purpose.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention. Having described and illustrated the principles of the technology with reference to specific implementations, it will be recognized that the technology can be implemented in many other, different, forms, and in many different environments. The technology disclosed herein can be used in combination with other technologies, and the embodiments of the invention described herein can be modified to accommodate and/or comply with changes and improvements in the applicable technology and standards referred to herein.

Having described the preferred embodiments of the invention, it will now become apparent to one of ordinary skill in the art that other embodiments incorporating their concepts may be used. These embodiments should not be limited to the disclosed embodiments, but rather should be limited only by the spirit and scope of the appended claims.

The invention claimed is:

1. A sigma delta modulator (SDM) data converter system, the SDM data conversion system having an order and comprising:
   a signal path receiving an input signal to be processed;
   a feedback signal path providing a feedback signal that is subtracted from the input signal; and
   a multi-bit quantizer disposed in a feedforward path so as to receive the input signal after the feedback signal has been subtracted from it, the multi-bit quantizer comprising a high pass filter having an order equal to the order of the SDM data conversion system and using feedforward dynamic element matching (DEM) to spectrally shape mismatch errors in the SDM data conversion system and produce an output signal, wherein the output signal of the multi-bit quantizer is used for at least a portion of the feedback signal.

2. The SDM data conversion system of claim 1, wherein the input signal comprises an analog signal and wherein the feedback path further comprises a multi-bit digital to analog converter (DAC) that receives the feedback signal from the multi-bit quantizer and processes the feedback signal before providing the feedback signal to the feedforward path for subtraction from the input signal.

3. The SDM data conversion system of claim 2, wherein the multi-bit quantizer has a first predetermined number of levels, wherein the predetermined number of levels is greater than two, and wherein the multi-bit DAC has the same number of levels as the multi-bit quantizer.

4. The SDM data conversion system of claim 2, further comprising a digital decimation filter that processes the digital output signal from the multi-bit quantizer to produce an output signal.

5. The SDM data conversion system of claim 4, wherein the multi-bit quantizer produces a low resolution high speed digital output signal and wherein the digital decimation filter generates a high resolution low speed output signal.

6. The SDM data conversion system of claim 5, wherein the digital decimation filter is constructed and arranged to attenuate high frequency quantization noise caused by a non-linear quantization function of the SDM data conversion system.

7. The SDM data conversion system of claim 5, wherein the digital decimation filter is constructed and arranged to suppress high frequency mismatch noise due to mismatches arising from the multi-bit DAC.

8. The SDM data conversion system of claim 1, further comprising a loop filter disposed in the signal path after the feedback signal has been subtracted from the input signal and before the input signal is provided to the multi-bit quantizer, wherein the loop filter is operable to filter the signal provided to the multi-bit quantizer so as to minimize the effects of any errors on a noise shaping characteristic of the SDM data conversion system.

9. The SDM data conversion system of claim 1, wherein the multi-bit quantizer uses a noise transfer function of the SDM data conversion system to spectrally shape the mismatch errors.

10. The SDM data conversion system of claim 1, wherein the multi bit quantizer has a first number of levels, nlev, where nlev >2.

11. The SDM data conversion system of claim 10, wherein the multi-bit quantizer further comprises:
a reference voltage generator that generates a set of reference voltages, the set comprising nlev-1 separate reference voltages, each reference voltage based at least in part on an input-output transfer characteristic of the multi-bit quantizer;
a set of nlev-1 multiplexers, each multiplexer receiving the set of reference voltages and selecting one of the set of reference voltages to be provided as a respective output voltage reference signal; and
a corresponding set of nlev-1 comparators, each respective comparator receiving the input signal to the multi-bit quantizer as a reference signal and also receiving the output voltage reference signal from a corresponding multiplexer as a comparison signal, each respective comparator producing a respective digital output signal based on a comparison between the reference signal and the comparison signal.

12. The SDM data conversion system of claim 11, further comprising a reference selection circuit (RSL) providing a common digital selection input signal to each of the nlev-1 multiplexers.

13. The SDM data conversion system of claim 12, wherein, based on the value of the common digital selection input signal, each respective multiplexer selects a respective reference voltage from the set of reference voltages and provides the selected reference voltage to the respective comparator as a comparison signal.

14. The SDM data conversion system of claim 12, wherein the RSL circuit is responsive to a clock input signal provided thereto, wherein, during the falling edge of the clock input signal, the value of the common digital selection input signal is changed.

15. The SDM data conversion system of claim 11, wherein a clock signal is coupled to each respective comparator, wherein each comparator performs its respective comparison of the reference signal and the comparison signal during a first portion of the clock signal and produces its respective digital output signal during a second portion of the clock signal.

16. The SDM data conversion system of claim 15, wherein the first portion of the clock signal is the high portion of the clock signal and wherein the second portion of the clock signal is the low portion of the clock signal.

17. The SDM data conversion system of claim 15, wherein the frequency of the clock signal is equivalent to a predetermined sampling frequency.

18. The SDM data conversion system of claim 15, wherein each comparator produces its respective digital output signal at each cycle of a sampling frequency signal, in response thereto.

19. The SDM data conversion system of claim 15, wherein the clock signal is provided to the RSL circuit which is responsive thereto, such that, during the falling edge of the clock input signal, the value of the common digital selection input signal is changed.

20. The SDM data conversion system of claim 11, wherein the reference voltage generator comprises at least one of a resistive ladder circuit and a capacitive ladder circuit.

21. The SDM data conversion system of claim 11, wherein the reference voltage generator further comprises at least one switched capacitor circuit.

22. The SDM data conversion system of claim 1, wherein the input signal is a digital signal and further comprising a multi-bit DAC receiving the output signal from the multi-bit quantizer, the multi-bit DAC having a predetermined nlev number of levels, where nlev >2, wherein the multi-bit DAC converts the digital output from the multi-bit quantizer into an analog signal of high frequency quantization.

23. The SDM data conversion system of claim 22, further comprising an analog low-pass filter that processes the analog signal from the multi-bit DAC to generate an analog output signal that is substantially free of noise.

24. The SDM data conversion system of claim 23, wherein the analog low-pass filter is constructed and arranged to attenuate high frequency quantization noise caused by a non-linear quantization function of the SDM data conversion system.

25. The SDM data conversion system of claim 24, wherein the analog low-pass filter is constructed and arranged to suppress high frequency mismatch noise.

26. A method for converting data in an SDM data conversion system having an order, the method comprising the unordered steps of:
receiving an input signal to be processed;
subtracting a feedback signal from the input signal;

quantizing the input signal after the feedback signal has been processed, the quantizing accomplished using a multi-bit guantizer comprising a high pass filter having an order equal to the order of the SDM data conversion system;

spectrally shaping mismatch errors in the input signal after the feedback signal has been subtracted from the input signal by using feedforward Dynamic Element Matching (DEM); and producing a digital output signal, where the output signal is used for at least a portion of a reference signal used during quantization of the input signal.

27. The method of claim 26, further comprising:
receiving an analog input signal; and
converting a digital feedback signal to an analog signal.

28. The method of claim 26, further comprising integrating the input signal after the feedback signal has been subtracted from the input signal and before the input signal has been quantized, wherein the integrating of the input signal minimizes at least some errors in the input signal.

29. The method of claim 26, further comprising using a noise transfer function to spectrally shape the mismatch errors.

30. The method of claim 26, wherein the quantization is accomplished with an nlev number of levels, where nlev >2.

31. The method of claim 30, further comprising:
generating a set of nlev-1 separate reference voltages;
selecting at least one of the nlev-1 reference voltages in accordance with a predetermined condition;
comparing at least one of the nlev-1 reference voltages to the input signal after the feedback signal has been subtracted from the input signal; and
generating a digital output signal based on the comparison.

32. The method of claim 31, further comprising selecting the reference voltage during a cycle of a clock signal.

33. The method of claim 32, further comprising generating the digital output signal during at least a portion of the clock signal.

34. The method of claim 33, further comprising changing the predetermined condition for selecting the reference voltage in response to a portion of the clock signal.

35. A sigma delta modulator (SDM) data conversion system, the SDM data conversion system having an order and comprising:

means for receiving an input signal to be processed;

means for subtracting a feedback signal from the input signal;

means for using feedforward dynamic element matching (DEM) to spectrally shape mismatch errors in the SDM data conversion system, the resultant shaping having an order equal to the order of the SDM system, wherein the order is greater than a first order; and means for producing an output signal, wherein the output signal is used for at least a portion of the feedback signal.

36. The SDM data conversion system of claim 35, further comprising means for using DEM to spectrally shape the mismatch errors without incurring additional delay in the feedback signal.

37. The SDM data conversion system of claim 35, further comprising means for using a noise transfer function of the SDM to spectrally shape mismatch errors in the SDM data conversion system.

* * * * *